United States Patent [19]

Piano

[11] Patent Number: 4,622,107
[45] Date of Patent: Nov. 11, 1986

[54] PROCESS FOR PREPARING THE THROUGH HOLE WALLS OF A PRINTED WIRING BOARD FOR ELECTROPLATING

[75] Inventor: Anthony M. Piano, Lodi, N.J.

[73] Assignee: Olin Hunt Specialty Products Inc., Palisades Park, N.J.

[21] Appl. No.: 859,661

[22] Filed: May 5, 1986

[51] Int. Cl.$^4$ ............................ C25D 5/02; C25D 5/54
[52] U.S. Cl. ........................................ 204/15; 204/20; 204/26
[58] Field of Search ...................... 204/15, 20, 26, 38.4

[56] References Cited

U.S. PATENT DOCUMENTS

| | | | |
|---|---|---|---|
| 409,096 | 8/1889 | Blank | 204/29 |
| 1,037,469 | 9/1912 | Goldberg | 427/123 |
| 1,352,331 | 9/1920 | Unno | 204/31 |
| 2,243,429 | 5/1941 | Laux | 204/30 |
| 2,947,064 | 8/1960 | Langton | 29/852 |
| 3,003,975 | 10/1961 | Louis | 252/503 |
| 3,014,818 | 12/1961 | Campbell | 428/549 |
| 3,099,608 | 7/1963 | Rodovsky et al. | 204/15 |
| 3,163,588 | 12/1964 | Shortt et al. | 204/16 |
| 3,249,559 | 5/1966 | Gallas | 252/510 |
| 3,696,054 | 10/1972 | Saunders | 252/511 |
| 3,799,802 | 3/1974 | Schneble, Jr. et al. | 204/29 |
| 3,910,852 | 10/1975 | Lederman et al. | 252/512 |
| 3,941,584 | 3/1976 | Tundermann et al. | 106/290 |
| 4,035,265 | 7/1977 | Saunders | 252/510 |
| 4,090,984 | 5/1978 | Lin et al. | 252/511 |
| 4,239,794 | 12/1980 | Allard | 428/219 |
| 4,305,847 | 12/1981 | Stoetzer et al. | 252/512 |
| 4,389,268 | 6/1983 | Oshima et al. | 156/150 |
| 4,478,882 | 10/1984 | Roberto | 427/97 |

OTHER PUBLICATIONS

Pending U.S. patent application Ser. No. 802,892, which was filed by Karl L. Minten and Galinia Pismennaya on Nov. 29, 1985.

*Primary Examiner*—T. M. Tufariello
*Attorney, Agent, or Firm*—William A. Simons; Thomas P. O'Day

[57] ABSTRACT

In the process for electroplating the walls of through holes in a laminated printed wiring board comprised of at least one non-conducting layer laminated to at least two separate conductive metal layers, which comprises the steps:
 (a) contacting said printed wiring board having said through holes with a liquid dispersion of carbon black comprised of:
  (1) carbon black particles having an average particle size of less than about 3.0 microns in said dispersion;
  (2) an effective dispersing amount of a surfactant which is compatible with said carbon black; and
  (3) a liquid dispersing medium, wherein the amount of carbon black is sufficient to coat substantially all of said non-conducting surfaces and is less than about 4% by weight of said liquid dispersion;
 (b) separating substantially all of the liquid dispersing medium from said dispersion, thereby depositing said carbon black particles in a substantially continuous layer on said non-conducting portions of said hole walls;
 (c) microetching said metal layers of said printed wiring board to remove deposited carbon black therefrom;
 (d) rinsing said printed wiring board to remove residual microetch therefrom; and
 (e) electroplating a substantially continuous metal layer over the deposited carbon black layer on said non-conducting portions of hole walls, thereby electrically connecting said metal layers of said printed wiring board;
wherein said improvement comprises:
 contacting said deposited carbon black particles after step (b) and before step (c) with aqueous solution of gas-forming compound selected from an alkaline carbonate, an alkaline sulfite and mixtures thereof.

15 Claims, No Drawings

PROCESS FOR PREPARING THE THROUGH HOLE WALLS OF A PRINTED WIRING BOARD FOR ELECTROPLATING

BACKGROUND OF THE INVENTION

1. Field of the Invention

This invention relates to an improved process for preparing the through hole walls of a printed wiring board (PWB) for electroplating.

2. Description of Related Art

For the past quarter century the printed wiring board industry has relied on the electroless copper deposition process to prepare through hole walls in printed wiring boards for electroplating. These plated through hole walls are necessary to achieve connections between two metal circuit patterns on each side of a printed wiring board or, in addition to this, between the inner layer circuit patterns of a multilayer board.

The electroless deposition of copper onto the through hole walls typically consists of precleaning a PWB and then processing according to the following sequence:

Step 1. Preactivator.
Step 2. Pd/Sn Activator.
Step 3. Rinse.
Step 4. Accelerator.
Step 5. Rinse.
Step 6. Electroless Copper Deposition.
Step 7. Electroplating. These processed boards may also be photoimaged before the electroplating process. Typically, the deposited copper layer on each through hole wall is about 1±0.2 mil thick.

Conventional electroless processes have several commercial disadvantages. They require a relatively long process time. The multiple treatment baths have complex chemistry which may require constant monitoring and individual ingredients which may require separate replenishment. The palladium/tin activator also may require expensive waste treatment. Furthermore, these electroless process baths may be very sensitive to contaminating. Finally, the multiplicity of rinse baths may require large amounts of water.

Prior to the electroless method of plating through holes, graphite was employed to prepare the walls of the through holes for plating. For example, U.S. Pat. No. 3,099,608, which issued to Radovsky et al on July 30, 1963, teaches a process for preparing the through hole walls of printed circuit boards for electroplating by initially depositing in said through holes a thin electrically non-conductive film of palladium metal in at least a semi-colloidal form. The patent discloses that graphite had been used previously as a conductive layer for electroplating thereon. See column 1, lines 63–70 and column 4, line 72 to column 5, line 11. These patentees noted several deficiencies with that graphite process including lack of control of the graphite application, poor deposit of the resultant electroplated metal, non-uniform through hole diameters, and low electrical resistance of the graphite.

U.S. Pat. No. 3,163,588, which issued to Shortt et al on Dec. 29, 1964, also mentions that graphite or its equivalents may be employed to render through hole walls of electric circuit boards conductive for later electroplating metals thereon. See column 3, line 45 to column 4, line 2.

Separately, graphite has been employed in numerous processes for preparing a non-conducting material for a metal coating or plating. For example, U.S. Pat. No. 409,096, which issued to Alois Blank on Aug. 13, 1889, teaches a process for applying copper to asbestos roofing material which comprises first applying powdered plumbago (graphite) in a volatile liquid such as varnish to the surface of the asbestos, then evaporating the volatile liquid to coat the asbestos fibers with fine particles of plumbago. The plumbago coated asbestos sheets are then immersed in a copper electroplating solution and electric current is applied to the coated asbestos sheet to form a thin film of copper thereon. The copper coated sheet is then immersed in a bath of molten metal such as tin, lead, or zinc, and is then removed from the molten bath to effect solidification of the molten metal. The resulting metal coated asbestos sheet is described as being relatively flexible, a non-conductor of heat and substantially fireproof.

U.S. Pat. No. 1,037,469, which issued to Goldberg on Sept. 3, 1912, and U.S. Pat. No. 1,352,331, which issued to Unno on Sept. 7, 1920, disclose processes for electroplating non-conducting materials by first coating the non-conducting material with wax, then coating the wax with a slurry of finely divided particles of graphite or other metal, followed by electroplating of the dust-coated surface with copper or other metal. Neither of these processes are particularly suitable for use in coating the hole walls of circuit boards because the holes are normally extremely narrow in diameter and immersing in wax would tend to plug the hole and prevent coating the hole walls with an electroplating material.

U.S. Pat. No. 2,243,429, which issued to Laux on May 27, 1941, discloses a process for electroplating a non-conductive surface by "graphiting" a thin layer onto the non-conducting surface followed by applying a copper layer electrolytically and "finally a further electrolytic deposit of another metal" is placed thereon.

Separately, carbon black formulations have been employed as conductive coatings for non-conductive materials. For example, U.S. Pat. No. 4,035,265, which issued to Saunders on July 12, 1977, discloses conductive paint compositions containing both graphite and carbon black along with air-hardenable binder. These paints are suitable for application to the walls of a building for use as a heating element.

U.S. Pat. No. 4,090,984, which issued to Lin et al on May 23, 1978, teaches a semi-conductive coating for glass fibers comprising (a) a polyacrylate emulsion; (b) electrically conductive carbon black dispersion and (c) a thixotropic gelling agent. The conductive carbon black dispersions employed are those comprising electrically conductive carbon black dispersed in from about 3 to about 4 percent by weight of a suitable dispersing agent.

U.S. Pat. No. 4,239,794, which issued to Allard on Dec. 16, 1980, teaches dispersing a conductive carbon black in a latex binder with a selected dispersing agent, then impregnating this carbon black dispersion into a non-woven fibrous web followed by drying any residual water, leaving a thin coating of carbon black dispersed on the surfaces of said fibers.

Pending U.S. patent application Ser. No. 802,892, which was filed by Karl L. Minten and Galina Pismennaya on Nov. 29, 1985, teaches a process of electroplating the through holes of a PWB which is a significant improvement over the known electroless techniques. By this process, a liquid dispersion of carbon black particles is first applied to the non-conductive portions of the through holes; then the liquid dispersion medium is separated (i.e. evaporated) from the carbon black particles, thereby depositing a substantially continuous layer of carbon black particles on the non-conductive surfaces of the through holes; and next a substantially continuous metal layer is electroplated over the deposited carbon black layer. This process of Minten and Pismennaya has several advantages over the known electroless techniques including the elimination of the preactivator, the Pd/Sn activator and the accelerator; less possibility of pollution problems; better bath stability; and fewer possible side reactions. This disclosure of the above-mentioned U.S. patent application of Minten and Pismennaya is incorporated herein by reference in its entirety.

While this Minten and Pismennaya application in itself teaches an effective means for electroplating through holes, there is still a need to improve the overall quality (i.e. achieve a void-free copper deposit) for all types of printed wiring boards, especially multilayer boards. Furthermore, while a preferred embodiment disclosed in this application employs a microetch to remove carbon black particles from the copper on metal surfaces of the PWB before electroplating, there is still a need to more thoroughly remove the carbon black off of these metal surfaces. In other words, it desirable to make that microetching step more effective.

This may be especially necessary with the inner copper foil layers inside the through holes of the PWB. If there is a relatively thick carbon black layer remaining on those copper foil layers during the electroplating step, that carbon black might insulate the copper foil layers from the plated-on copper layer and, thus prevent a good electrolyic connection between them. Also, in some instances, there is loose excess deposits of carbon black on the non-conductive (e.g. epoxy/fiberglass) portions of the through holes. If electroplating proceeds with these loose excess deposits present, the plating surface over these portions may not be smooth.

It is a primary object of this invention is to provide an improved electroplating process for applying a conductive metal layer to the through hole walls of printed wiring boards over the process disclosed in the above-noted Minten and Pismennaya patent application.

It is another object of this invention to provide an even more economical process for applying a conductive metal layer to the surfaces of non-conducting layers of printed wiring boards than presently known electroless processes.

BRIEF DESCRIPTION OF THE INVENTION

Accordingly, the present invention accomplishes the foregoing objects by providing an improvement to the process for electroplating the walls of through holes in a laminated printed wiring board comprised of at least one non-conductive layer laminated to at least two separate conductive metal layers, which comprise the steps:

(a) contacting said printed wiring board having said through holes with a liquid dispersion of carbon black comprised of:
  (1) carbon black particles having an average particle size of less than about 3.0 microns in said dispersion;
  (2) an effective dispersing amount of a surfactant which is compatible with said carbon black; and
  (3) a liquid dispersing medium, wherein the amount of carbon black is sufficient to coat substantially all of said non-conducting surfaces and is less than about 4% by weight of said liquid dispersion;

(b) separating substantially all of the liquid dispersing medium from said dispersion, thereby depositing said carbon black particles in a substantially continuous layer on said non-conducting portions of said hole walls;

(c) microetching said metal layers of said printed wiring board to remove deposited carbon black therefrom;

(d) rinsing said printed wiring board to remove risidual microetch therefrom; and (e) electroplating a substantially continuous metal layer over the deposited carbon black layer on said non-conducting portions of hole walls, thereby electrically connecting said metal layers of said printed wiring board;

wherein said improvement comprises:
contacting said deposited carbon black particles after step (b) and before step (c) with aqueous solution of a gas-forming compound selected from an alkaline carbonate, an alkaline sulfite and mixtures thereof.

These printed wiring boards are usually comprised of an epoxy resin/glass fiber mixture positioned between two conductive metal layers (e.g. copper or nickel plates or foils) or a multiplicity of said alternating layers. Applying a conducting metal layer over said non-conducting portions of said through hole walls electrically connects the conductive metal layers.

DESCRIPTION OF THE PREFERRED EMBODIMENT

The present invention is directed toward preparing the through hole walls of a printed wiring board for the application of an electroplated layer of copper over a non-conducting·layer separating two plates or foils of copper.

This preparation process entails placing a selected liquid carbon black dispersion over the non-conducting portions of the through hole walls before electroplating. The liquid carbon black dispersion is a complete replacement for the electroless copper bath and all of its attendant process chemistry. That is, it replaces the preactivator step, the Pd/Sn activator, the accelerator step and the electroless bath itself.

After the dispersion medium has been removed and the carbon black particles have been deposited on the through hole walls, the critical feature of the present invention contemplates contacting (e.g. immersing) the deposit with an aqueous solution containing a gas-forming substance (e.g. sodium carbonate, potassium carbonate or sodium sulfite) to remove any loosely held on carbon black particles. This step works together with the standard microetch step to more effectively remove carbon black particles from the metal surfaces of the PWB and make the remaining carbon black surfaces on the non-conductive portions of the PWB very smooth for electroplating.

Printed wiring boards (also known as printed circuit boards) are generally laminated materials comprised of two or more plates or foils of copper, which are separated from each other by a layer of non-conducting material. Although copper is generally used as the electroplating metal in printed wiring boards, those skilled in the art will recognize that other metals such as nickel, gold, palladium, silver and the like can also be electroplated by the process of this invention. The non-con ducting layer or layers are preferably an organic material such as an epoxy resin impregnated with glass fiber particles. However, the non-conducting layer may also be comprised of thermosetting resins, thermoplastic resins, and mixtures thereof, with or without reinforcing materials such as fiberglass and fillers.

Suitable thermoplastic resins include the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon, polyethylene; polypropylene, polystyrene; styrene blends, such as acrylonitrile styrene co-polymers and acrylonitrile-butadiene-styrene (ABS) co-polymers; polycarbonates; polychlorotrifluoroethylene; and vinyl polymers and co-polymers, such as vinyl acetate, vinyl alcohol, vinyl butyral, vinyl chloride, vinyl chloride-acetate co-polymer, vinylidene chloride and vinyl formal.

Suitable thermosetting resins include alkyl phthalate, furane; melamine-formaldehyde; phenol formaldehyde and phenol-furfural co-polymer; alone or compounded with butadiene acrylonitrile co-polymer or acrylonitrile-butadiene-styrene (ABS) co-polymers; polyacrylic esters; silicones; urea formaldehydes; epoxy resins, polyimides, alkyl resins, glyceryl phthalates; polyesters; and the like.

In many printed wiring board designs, the electrical pathway or pattern requires a connection between the separated copper plates at certain points in the pattern. This is usually accomplished by drilling holes at the desired locations through the laminate of copper plates and the non-conducting layer and then connecting the separate metal plates. The hole diameters of printed wiring boards generally range from between about 0.5 and about 10 millimeters in diameter, preferably from about 1 to about 5 millimeters.

After drilling these through holes, it may be desirable to deburr the holes to make the hole walls relatively smooth. In the case of multilayer printed wiring boards, it may also be desirable to subject the boards to a desmear or etchback operations to clean the inner copper interfacing surfaces of the through holes. Suitable preparative operations include any or all of the presently available conventional operations.

Once the surfaces of through holes have been made relatively smooth for plating, it is preferred to subject the PWB to a precleaning process in order to place the printed wiring board in condition for receiving the liquid carbon black dispersion. In one preferred precleaning operation, the printed wiring board is first placed in a cleaner/conditioner bath for about 5 minutes at a temperature of about 60° C. to remove grease and other impurities from the hole wall surfaces. In this embodiment, one preferred cleaner/conditioner is comprised of monoethanolamine, a nonionic surfactant and ethylene glycol in water. Suitable cleaner/conditioner formulations are available under the product name "Cleaner/Conditioner 102", "BLACKHOLE Cleaner 21", and "BLACKHOLE Cleaner 22" by the Olin Hunt Specialty Products, Inc. of West Paterson, N. J.

After the application of the cleaner/conditioner, the PWB is subsequently rinsed in water to remove excess cleaner/conditioner from the board. Next, it may be desirable to clean the outer copper surfaces. This may be accomplished by immersing the board in a sodium persulfate microetch solution or an aqueous sulfuric acid solution or both. A suitable persulfate microetch solution is "BLACKHOLE MICROCLEAN 41" available from the Olin Hunt Specialty Products, Inc. of West Paterson, N. J. It is preferably combined with sufficient sulfuric acid to make a microetch bath containing 200 gm of sodium persulfate per liter and 0.5% by volume sulfuric acid. Neither the sodium persulfate microetch or the sulfuric acid solution is known to effect the epoxy/glass fiber surfaces or portions of the through holes of the PWB. It should be recognized that none of the above-mentioned hole drilling or precleaning operations is a critical feature of the present invention. Any and all conventional equivalents to these operations may be used instead.

The precleaned PWB is first preferably contacted he alkaline hydroxide pre-conditioner if an alkaline carbon black dispersion is employed. This pre-conditioner is preferably an aqueous solution of an alkaline hydroxide. The amount of alkaline hydroxide in this preferred pre-conditioning step should be sufficient to wet substantially all of the non-conductive portions of the through holes. The preferred amounts of alkaline hydroxide may vary from about 2 to about 30 grams per liter of deionized water; more preferably, from about 4 to about 15 grams per liter. The preferred alkali metal hydroxide is potassium hydroxide, although other alkali metal (e.g. sodium) and alkaline earth metal (e.g. calcium) hydroxides as well as ammonium hydroxide may also be used. It is believed that this step prepares the through hole surfaces to have better wettability (adhesion) with the alkaline carbon black dispersion, especially with multilayer PWBs. In other words, this step prepares the non-conductive surfaces of the PWB with the same environment as alkaline carbon black dispersion effects. This step also protects the carbon black dispersion bath from drag-in of harmful contamination from the prior pre-cleaning and rinse steps. It is more economical to change this pre-conditioner bath frequently than change the carbon black dispersion bath at the same frequency. This contacting step may be carried out by placing the PWB in a bath containing the pre-conditioner solution at a temperature from about 20° C. to about 70° C. for a period from about 1 to about 15 minutes.

The liquid carbon black dispersion is next applied to or contacted with the pre-conditioned PWB. This dispersion contains three critical ingredients, namely, carbon black, one or more surfactants capable of dispersing the carbon black and a liquid dispersing medium such as water. The preferred method of applying the dispersion to the PWB include immersion, spraying or other methods of applying chemicals used in the PWB industry. A single working bath is sufficient for applying this carbon black dispersion; however, more than one bath may be used for rework or other purposes.

In preparing this liquid dispersion, the three critical ingredients and any other preferred ingredients are thoroughly mixed together to form a stable dispersion. This may be accomplished by subjecting aconcentrated form of the dispersion to ball milling, colloidal milling, high-shear milling or ultrasonic techniques. The thoroughly mixed dispersion is later diluted with more water while agitating to the desired concentration for the working bath. The preferred method of mixing is ball milling a concentrated form of the dispersion in a container having glass mineral or plastic beads therein for a period of about 1 to about 24 hours. This thorough mixing allows for the carbon black particles to be intimately coated or wetted with the surfactant. This mixed concentrate is then mixed with water or some other liquid dispersing medium to the desired concentration. The working bath is preferably kept agitated during both the diluting and applying steps to aid in keeping the dispersion stable.

As stated above, the carbon black particles should have an average particle diameter below about 3 microns while in the dispersion. It is desirable to have this average particle diameter of carbon black as small as possible to obtain the desired plating characteristics of substantially even plating and no plating pullaways. It is preferred that the carbon black particles have an average particle diameter from about 0.1 to about 3.0, more preferably from 0.2 and about 2.0, microns when in said dispersion. The term "average particle diameter" as employed herein in both the specification and claims refers to average mean diameter of the particles (the average by number). The average mean diameter in the dispersion may be determined through the use of either a NiComp Model 270 submicron particle sizer (Version 3.0) or a HIAC PA-720 automatic particle size analyzer (both available from the HIAC/ROYCO Instrument Division of Pacific Scientific of Menlo Park, Calif.).

All types of carbon blacks may be used for this invention including the commonly available furnace blacks. However, it is preferred to utilize carbon blacks which are initially acidic or neutral, i.e. those which have a pH of between about 1 and about 7.5 and more preferably between about 2 and about 4 when slurried with water. Carbon black particles of the preferred type contain between about 1 and about 10 percent by weight of volatiles and have an amorphous structure.

These preferred carbon black particles are also very porous and generally their surface areas are from between about 45 to about 1100, and preferably between about 300 and about 600, square meters per gram by the BET method (method of Brunauer-Emmett-Teller).

Illustrative carbon blacks suitable for use of this invention include Cabot XC-72R Conductive, Cabot Monarch 800, Cabot Monarch 1300, all manufactured by Cabot Corporation of Boston, Mass. Other suitable carbon blacks include Columbian T-10189, Columbian Conductex 975 Conductive, Columbian CC-40-220, and Columbian Raven 3500, all available from Columbian Carbon Company of New York, N.Y. Monarch 800 and Raven 3500 are the two most preferred carbon blacks because of their ease of dispersion and low pH.

The term "liquid dispersing medium" as used herein in the present specification and claims includes water and polar organic solvents (both protic and aprotic). Suitable protic polar organic solvents may include lower alcohols ($C_1$–$C_4$) such as methanol, ethanol, isopropanol and isobutanol; polyhydric alcohols such as glycols (i.e. triethylene glycols); ether-alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); N-methylpyrrolidine; dimethylsulfoxide (DMSO); and esters of carboxylic acids such as methylformate, ethylacetate and cellosolve acetate. The preferred liquid dispersing medium is water because of cost and ease of use considerations. It is preferred to utilize deionized water which is free of lime, fluorine, iodine and other impurities normally found in tap water, in order to minimize interference of foreign ions during the subsequent electroplating step.

In addition to the water and carbon black, a third critical ingredient is needed in the dispersion, namely, a surfactant capable of dispersing said carbon black in said liquid dispersing medium (i.e. compatible with said carbon black and liquid dispersing medium). One or more of these is added to the dispersion in order to enhance the wetting ability and stability of the carbon black and permit maximum penetration by the carbon black within the pores and fibers of the non-conducting layer. Suitable wetting agents include anionic, nonionic and cationic surfactants (or combinations thereof such as amphoteric surfactants). The surfactants should be soluble, stable and preferably nonfoaming in the liquid carbon black dispersion. In general, for a polar continuous phase as in water, the surfactants should preferably have a high HLB number (8–18). The preferred type of surfactant will depend mainly on the pH of the dispersion. If the total dispersion is alkaline (i.e. has an overall pH in the basic range), it is preferred to employ an anionic or nonionic surfactant. Acceptable anionic surfactants include sodium or potassium salts of naphthalene sulfonic acid such as DARVAN No. 1 (R. T. Vanderbilt Co.), ECCOWET LF (Eastern Color and Chemical), PETRO AA, PETRO ULF (Petro Chemical Co., Inc.), and AEROSOL OT (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid carbon black dispersion is MAPHOS 56. Suitable nonionic surfactants include ethoxylated nonyl phenols such as POLY-TERGENT B-series (Olin Corporation) or alkoxylated linear alcohols such as POLY-TERGENT SL-series (Olin Corporation).

If the total dispersion is acidic, it is preferred to employ selected anionic surfactants or cationic surfactants. An acceptable group of anionic surfactants would be the sodium or potassium salts of naphthalene sulfonic acid described above. Acceptable cationic surfactants include ceytl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2Al (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemicals Inc.). Combinations of surfactants may be employed.

The amount of carbon black in the dispersion should be less than about 4% by weight of the dispersion, preferably, less than about 2% by weight. It has been found that the use of higher concentrations of carbon blacks provide undesirable plating characteristics. In the same regard, the solids content (i.e. all of the ingredients other than the liquid dispersing medium) is preferably less than 10% by weight of the dispersion, more preferably, less than about 5.6% by weight.

The three above-noted critical components of the present invention, namely, the carbon black, liquid dispersing medium and surfactant, may be employed alone to form a liquid dispersion. In some situations, it may be desirable to add other preferred ingredients to this dispersion.

One additional preferred component of the liquid carbon black-containing dispersion is a strong basic material such as an alkaline hydroxide. Suitable strong basic materials include alkali metal hydroxides such as potassium hydroxide, sodium hydroxide, and lithium hydroxide. Ammonium hydroxide or alkaline earth metal hydroxides such as calcium hydroxide may also be employed, if desired. Potassium hydroxide is the most preferred strong basic material. The term "alkaline hydroxide" is used throughout the description and claims to identify these strong basic materials used in both this step and the pre-conditioning step. Sufficient alkaline hydroxide may be added to the liquid carbon black dispersion in a proportion sufficient to increase the pH of the resulting carbon black-containing dispersion to between about 10 and about 14, and preferably between about 10 and about 12.

The alkaline hydroxide may be added to the dispersion singly or in combination with silica. One preferred type of silica is fumed silica. One suitable fumed silica is in the form of super dense particles and is sold commercially under the trademark CAB-O-SIL MS-7SD by the Cabot Corporation. However, other fumed silica of suitable bulk density and particle size may be employed. The bulk density of suitable fumed silica is generally in the range of between about 5 to about 10, pounds per cubic foot. The desired particle size diameter of the fumed silica is generally in a range of between about 0.005 and about 0.025, and more preferably in the range of between about 0.01 and about 0.015 microns.

When employed together, the alkaline hydroxide reacts in situ with the fumed silica particles to form the corresponding soluble alkaline silicate. Excess alkaline hydroxide may be present so that the dispersion contains both the hydroxide and silicate. Lithium hydroxide and alkali earth metal hydroxides such as calcium hydroxide should not be used with silica because resulting silicates precipitate.

The porous nature of the carbon black particles enchances absorption of alkaline silicate from the liquid dispersion. As a result, there is a relatively high concentration of alkaline silicate in the pores of the carbon black particles after drying. The presence of alkaline silicate in the pores appears to enhance the conductivity of the carbon black particles during the subsequent electroplating step.

In an alternative embodiment of the present invention, the alkaline hydroxide and silica may be replaced with a mineral acid. The resulting acidic carbon black dispersion may be made up of any suitable mineral acid such as HCl, $H_2SO_4$, $H_3PO_4$ and the like. $HNO_3$ should be excluded because of its undesirable reaction with copper. Generally, a suitable concentration of acid is about 1 Normal.

Following is a typical formulation of a suitable aqueous alkaline dispersion of carbon black showing the general range of proportions as well as the preferred range of proportions for the various components:

| Component | General Range | Preferred Range |
|---|---|---|
| Carbon Black | 0.1–4% by wt. | 0.2–2% by wt. |
| Surfactant | 0.01–4% | 0.05–2% |
| Alkaline Hydroxide | 0–1% | 0.4–0.8% |
| Fumed Silica | 0–1% | 0.2–0.8% |
| Water | balance | balance |

The liquid dispersion of carbon black is typically placed in a suitable agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the pretreated printed wiring board is immersed therein. The period of immersion generally ranges from about 1 to about 10, and preferably from about 3 and about 5 minutes. During immersion, the liquid carbon black-containing dispersion penetrates the holes of the printed wiring board and wets and contacts the glass fiber as well as the epoxy resin which forms the components of the insulating layer. The immersed board is then removed from the bath of the liquid carbon black-containing dispersion and is then preferably contacted with compressed air to unplug any printed wiring board holes that may still retain plugs of the dispersion. In addition, excess basic liquid carbon black-containing dispersion is removed from the face of the copper plates.

The carbon black-covered board is then subjected to a step where substantially all (i.e. over about 95% by weight) of the water in the applied dispersion is removed and a dried deposit containing carbon black is left in the holes and on other exposed surfaces of the non-conducting layer. This may be accomplished by several methods such as by evaporation at room temperature, by a vacuum, or by heating the board for a short time at an elevated temperature, or by other equivalent means. Heating at an elevated temperature is the preferred method. Heating is generally carried out for between about 5 and about 45 minutes at a temperature of from about 75° C. to about 120° C., more preferably from about 80° C. to 98° C. To insure complete coverage of the hole walls, the procedure of immersing the board in the liquid carbon black dispersion and then drying may be repeated one or more times.

This drying step yields a board which may be completely coated with the carbon black dispersion. This dispersion is not only coated on the drilled hole surfaces, which is desirable, but also entirely coats the copper plate or foil surfaces which is undesirable. Thus prior to any photoimaging process all carbon black must be removed from the copper plate or foil surface.

As a critical feature of the present invention, the dried deposit of carbon black in the through holes is then contacted with an aqueous solution containing a gas-forming substance. The functions of this step include removing excess carbon black material on the corners and walls of the PWB through holes and remove any loose carbon black particles from the through hole walls which might cause an undesirable uneven plated surface to result.

The preferred gas-forming substances are alkaline carbonates and sulfites such as potassium carbonate, sodium carbonate, potassium sulfite and sodium sulfite. The amount of these gas-forming substances should be sufficient to remove substantially all of the loose or easily removable carbon black particles from the through holes. This gas-forming substance will react with a sulfuric acid or an equivalent acid in the following step according to equations (A) or (B):

$$H_2SO_4 + Na_2CO_3 \rightarrow Na_2SO_4 + H_2O + CO_2(\downarrow) \quad (A)$$

$$H_2SO_4 + Na_2SO_3 \rightarrow Na_2SO_4 + H_2O + SO_2(\downarrow) \quad (B)$$

The $CO_2$ and $SO_2$ formed by these reactions will both increase the surface porosity of the deposited carbon black as well as remove any loosely-attached particles of carbon black, thereby leave an excellent surface for electroplating. The term "gas-forming substance" as used herein is an alkaline salt which forms a gas when placed in an acidic environment. The preferred amounts may vary from about 10 to about 75 grams per liter of water employed. This contacting step may be carried out by placing the PWB in an aqueous bath containing the gas-forming substance at a temperature from about 20° C. to about 50° C. for about 1 to about 15 minutes.

The removal of the carbon black, specifically from the outer copper surfaces including, especially, the rims of the drilled holes while leaving the coating intact on the glass fibers and epoxy surface of the hole walls, may be achieved by the employment of a mechanically scrubbing operation or a microetch or both. The microetch is preferred because of ease of use. One suitable sodium persulfate microetch is "BLACKHOLE MICROCLEAN 41" available from Olin Hunt Specialty Products, Inc. and referred to above. The mechanism by which this microetch works is by not attacking the carbon black material deposited on the copper foil directly, but rather to attack exclusively the first few atomic layers of copper directly below which provides the adhesion for the coating. Hence, the fully coated board is immersed in the microetch solution to "flake" off the carbon black from the copper surfaces into solution in the form of micro-flakelets. These micro-flakelets are removed from the microetch bath either by filtration through a pump or via a weir type filter arrangement commonly used in the PWB industry. The liquid carbon black dispersion, the microetch, and the subsequent water rinse are preferably carried out by immersing the PWB in a bath constructed of polypropylene or polyvinyl chloride (PVC) and kept agitated by a recirculation pump or pumped in air.

In the case of a multilayer type board this combination of employing a gas-forming substance followed by a microetching step is especially advantageous. This procedure performs three very desirable tasks:

A. It removes substantially all excess carbon black material adhering to the outer copper plates or foils and the exposed surfaces of copper inner plates or foils in multilayer PWB.

B. It chemically cleans and microetches slightly the outer copper surfaces, thereby making them excellent bases for either dry film application or the electrolytic deposition of copper when followed by mechanically scrubbing the PWB.

C. It chemically cleans the edges of the copper plate or foil around the drilled holes. This ensures no carbon black material contaminates the interface region between the electrolytically deposited copper layer of the hole wall surface and the edges of the copper outer foil.

After the microetch step and a subsequent water rinse, the PWB may now either proceed to the photoimaging process and later be electroplated or be directly panel electroplated.

The thus treated printed wiring board is then immersed in a suitable electroplating bath for applying a copper coating on the hole walls of the non-conducting layer.

The present invention contemplates the use of any and all electroplating operations conventionally employed in applying a metal layer to the through hole walls of a PWB. Therefore this claimed invention should not be limited to any particular electroplating bath parameters.

A typical copper electroplating bath is comprised of the following components in the following proportions:

| Component | General Proportions | Preferred Proportions |
|---|---|---|
| Copper (as metal) | 2-2.5 oz/gal | 2.25 oz/gal |
| Copper Sulfate | 8-10 oz/gal | 9 oz/gal |
| 98% Concentrated $H_2SO_4$ (by weight) | 23-30 oz/gal | 27 oz/gal |
| Chloride Ion | 20-100 mg/l | 50 mg/l |

The electroplating bath is normally agitated and preferably maintained at a temperature of between about 20° C. and about 25° C. The electroplating bath is provided with anodes, generally constructed of copper, and the printed wiring board to be plated is connected as a cathode to the electroplating circuit. For example, a current of about 15 amps per square foot is impressed across the electroplating circuit for a period of between about 60 and about 90 minutes in order to effect copper plating on the hole walls of the non-conducting layer positioned between the two plates of copper up to a thickness of about 1 mil±0.2 mil. This copper plating of the hole wall provided a current path between the copper layers of the printed wiring board. Other suitable electroplating conditions may be employed, if desired. Other electroplating bath compositions containing other copper salts or other metal salts such as salts of nickel, gold, palladium, silver and the like may be employed, if desired.

The printed wiring board is removed from the copper electroplating bath and then washed and dried to provide a board which is further processed by applying photoresist compounds and the like, as is known in the art for the preparation of printed wiring boards.

It has been found that, even with excess dwell time in the liquid carbon black bath, the resulting carbon black coating does not appreciably increase in thickness. This seems to mean that this is a surface adsorption process and once coverage is attained over the entire surface of the hole profile, no more build up of material will take place.

The following example is presented to define the invention more fully without any intention of being limited thereby. All parts and percentages are by weight unless otherwise explicitly specified.

Printed Wiring Circuit Board Specifications

A laminated printed wiring board was treated by the process of this invention. This printed wiring board was comprised of two 35 micron thick copper plates secured by pressure fusing to opposite sides to an epoxy resin/glass fiber layer. This epoxy resin/glass fiber layer was about 1.55 mm. thick for each board. This printed wiring board was about 46 centimeters wide and about 61 centimeters in length. There were about 1000 to about 2000 holes, each about 1.0 millimeters in diameter, drilled through the copper plates and epoxy resin/glass fiber layer.

EXAMPLE 1

This drilled printed wiring board described above was prepared for copper electroplating its through holes by first mechanical scrubbing the surfaces of the board and then immersing it in the following sequence of aqueous baths (each about 132 liters volume) for the indicated times:
1. Cleaner/Conditioner (5 minutes)
2. Rinse with Tap Water (6 minutes)
3. Potassium Hydroxide Pre-conditioner (5 minutes)
4. Carbon Black Preplating Dispersion (4 minutes) [Dry at 93° C. (20 minutes)]
5. Sodium Carbonate Premicroetch Conditioner (3 minutes)
6. Sodium Persulfate Microetch (2 minutes)
7. Rinse with Tap Water (1 minute)

Bath 1 was an aqueous solution containing a cleaner/conditioner formulation comprised of monoethanolamine, a nonionic surfactant and ethylene glycol in water to remove grease and other impurities from the hole wall surfaces of the board. The bath was heated to about 60° C. to facilitate this cleaning. The cleaner/conditioner formulation is available under the trademark "BLACKHOLE Cleaner 21" by Olin Hunt Specialty Products, Inc. of West Paterson, New Jersey.

Bath 3 was a room temperature aqueous bath which contained 6.1 grams of potassium hydroxide per liter of deionized water. Its function was to prepare the board and make its through holes more receptive to the carbon black dispersion and to protect the carbon black dispersion from drag-in of harmful contamination. This potassium hydroxide pre-conditioner was "BLACKHOLE Pre-conditioner 31" available from Olin Hunt Specialty Products, Inc. of West Paterson, New Jersey.

Bath 4 is a room temperature deionized water bath containing the carbon black preplating formulation. In this bath, the proportions of each ingredient were as follows:

| | |
|---|---|
| 0.06% by weight anionic surfactant [1] | |
| 0.46% by weight KOH [2] | |
| 0.31% by weight fumed silica [3] | |
| 0.21% by weight carbon black [4] | |
| 1.04% by weight total solids | |

[1] MAPHOS 56 an anionic surfactant produced by Mazer Chemicals Inc. of Gurnee, Illinois (90% by weight surfactant, 10% by weight $H_2O$).
[2] Solid potassium hydroxide pellets (86% by weight KOH, 14% by weight $H_2O$).
[3] CAB-O-SIL MS-7SD fumed silica produced by Cabot Corporation.
[4] RAVEN 3500 carbon black produced by Cabot Corporation.

The balance of the bath was deionized water. This carbon black dispersion of Bath 4 was prepared by milling a concentrated form of this dispersion in a pebble mill containing stone pebbles so that the concentration of pebbles occupied about one third of the mill volume. The surfactant was dissolved in deionized water/KOH/silica to give a continuous phase. Then the carbon black was added. Milling time was six hours. After milling, the concentrate was diluted with sufficient deionized water to make the dispersion in the above-indicated proportions.

After Bath 4, the board was placed in a hot air recirculatory oven and heated to 93° C. for 20 minutes. This drying step removed the water from the carbon black coating on the board, thereby leaving a dried deposit of carbon black all over the board and in the through holes of the board. The drying promotes adhesion between the carbon black and the non-conductive surfaces of the board.

Bath 5 was an aqueous bath heated to 49° C. and contained 40 grams of sodium carbonate monohydrate ($N_2CO_3$ $H_2O$) per liter of deionized water. Its function was to facilitate the removal of dried carbon black material from copper surfaces of the board in the following sodium persulfate/$H_2SO_4$ microetch step and to remove excess carbon black material from the hole walls. This sodium carbonate premicroetch conditioner is available under the trademark "BLACKHOLE NS Conditioner" available from Olin Hunt Specialty Products, Inc. of West Paterson, New Jersey.

Bath 6 was a room temperature aqueous bath and contained 200 grams of sodium persulfate per liter of deionized water and 0.5% by volume of concentrated $H_2SO_4$. Its function was to microetch the copper surfaces of the board so as to remove the deposited carbon black from the surfaces. It does not act on the epoxy/glass surfaces. The $H_2SO_4$ in this microetch formulation reacts with the sodium carbonate so as to form $CO_2$ which cracks the carbon black deposit and allows the microetch to work better. This sodium persulfate microetch was made from "BLACKHOLE MICROCLEAN 41" and is available from Olin Hunt Specialty Products, Inc. of West Paterson, New Jersey.

Rinse baths 2 and 7 were employed to prevent the carryover of chemicals from one treatment bath into the next.

After treatment with this sequence of baths, the printed wiring board was mechanically scrubbed in a Chemcut Surface Cleaner/Finisher Model No. 107I available from Chemcut Co. of State College, PA to remove any residual deposited carbon black dispersion on the outer copper surfaces of the board and then placed in an electroplating bath provided with agitation means and heating means and which contained an electrolyte bath comprised of the following:

Plating Bath Composition

| Component | Proportion |
|---|---|
| Copper sulfate | 6.2 oz/gal |
| 98% Conc. $H_2SO_4$ (by weight) | 30 oz/gal |
| Chloride Ion | 40 mg/l |

The printed wiring board was connected as a cathode in the electroplating vessel having a volume of about 284 liters. Two copper bars were immersed in the electrolyte and connected to the cell circuits as anodes. The copper bars had a length of about 46 cm; a width of about 9 cm and a thickness of about 4 cm. Each face was about 414 square cm. A direct current of 15 amps per square foot was impressed across the electrodes in the electroplating bath for approximately 75 minutes. The bath was maintained at a temperature of about 25° C. during this period and agitation was effected by air sparging. At the end of this period, the printed wiring board was disconnected from the electroplating circuit removed from the electrolyte, washed with tap water and dried.

An examination of the resulting electroplated board showed that the hole walls were coated with a relatively uniform layer of copper (1.0 mil ±0.2 mil) and no "dog boning" was observed (i.e. this latter effect is an undesirable condition where the plated layer is thicker near the copper laminate areas of the PWB). In a standard adhesion test[5], there was no removal of the electroplated copper from the hole walls of the epoxy/glass fiber layer component.

[5] IPC Test No. 2.6.8B "Thermal Stress Methodology Via Solder Float Test" generally referred to as the standard solder shock test.

What is claimed is:

1. In the process for electroplating the walls of through holes in a laminated printed wiring board comprised of at least one non-conducting layer laminated to at least two separate conductive metal layers, which comprises the steps:
    (a) contacting said printed wiring board having said through holes with a liquid dispersion of carbon black comprised of:
       (1) carbon black particles having an average particle size of less than about 3.0 microns in said dispersion;
       (2) an effective dispersing amount of a surfactant which is compatible with said carbon black; and
       (3) a liquid dispersing medium, wherein the amount of carbon black is sufficient to coat substantially all of said non-conducting surfaces and is less than about 4% by weight of said liquid dispersion;
    (b) separating substantially all of the liquid dispersing medium from said dispersion, thereby depositing said carbon black particles in a substantially continuous layer on said non-conducting portions of said hole walls;
    (c) microetching said metal layers of said printed wiring board to remove deposited carbon black therefrom;
    (d) rinsing said printed wiring board to remove residual microetch therefrom; and
    (e) electroplating a substantially continuous metal layer over the deposited carbon black layer on said non-conducting portions of hole walls, thereby electrically connecting said metal layers of said printed wiring board;
wherein said improvement comprises:
    contacting said deposited carbon black particles after step (b) and before step (c) with aqueous solution of a gas-forming compound selected from an alkaline carbonate, an alkaline sulfite and mixtures thereof.

2. The process of claim 1 wherein said gas-forming substance is selected from the group consisting of sodium carbonate and potassium carbonate.

3. The process of claim 1 wherein said gas-forming substance is sodium sulfite and potassium sulfite.

4. The process of claim 1 wherein said contacting step of the improvement is carried out by immersing the printed wiring board in a bath containing said gas-forming substance.

5. The process of claim 1 wherein said contacting step of the improvement occurs at a temperature from about 20° C. to about 50° C.

6. The process of claim 1 wherein said contacting step of the improvement is carried out by placing said printed wire board in an aqueous bath containing said gas-forming substance at a temperature from about 20° C. to about 50° C. and said solution comprising water and about 20 to about 75 grams of sodium carbonate per liter of water.

7. The process of claim 6 wherein said liquid carbon black dispersion further comprises a sufficient amount of at least one alkaline hydroxide to raise the pH of said liquid dispersion in the range from about 10 to 14.

8. The process of claim 7 wherein said liquid dispersion further comprises an alkaline silicate, which is formed by the reaction of fumed silica particles and said alkaline hydroxide.

9. The process of claim 8 wherein said liquid dispersion contains less than about 10% by weight solids constituents.

10. The process of claim 7 wherein said carbon black particles have an initial pH from about 2 to about 4.

11. The process of claim 7 wherein said printed wiring board is contacted with an alkaline hydroxide solution before step (a).

12. The process of claim 7 wherein said surfactant is a phosphate ester anionic surfactant.

13. The process of claim 7 wherein said conductive metal is copper.

14. The process of claim 7 wherein said liquid dispersing medium is water.

15. The process of claim 7 wherein said microetch in step (c) comprises sodium persulfate and sulfuric acid.

* * * * *

UNITED STATES PATENT AND TRADEMARK OFFICE
CERTIFICATE OF CORRECTION

PATENT NO. : 4,622,107
DATED : November 11, 1986
INVENTOR(S) : Anthony M. Piano

It is certified that error appears in the above-identified patent and that said Letters Patent is hereby corrected as shown below:

In column 5, at line 1 delete "layers-are" and insert --layers are--.

In column 6, at line 13 delete "he" and insert --with the--.

In column 11, at line 4 delete "$H_2SO_4+Na_2CO_3 \longrightarrow Na_2SO_4+H_2O+CO_2(\downarrow)$" and insert --$H_2SO_4+Na_2CO_3 \longrightarrow Na_2SO_4+H_2O+CO_2(\uparrow)$--.

In column 11, at line 6 delete "$H_2SO_4+Na_2SO_3 \longrightarrow Na_2SO_4+H_2O+SO_2(\downarrow)$" and insert --$H_2SO_4+Na_2SO_3 \longrightarrow Na_2SO_4+H_2O+SO_2(\uparrow)$--.

In column 14, at line 5 delete "$(N_2CO_3H_2O)$" and insert --$(Na_2CO_3H_2O)$--.

Signed and Sealed this

Eighth Day of December, 1987

Attest:

DONALD J. QUIGG

Attesting Officer

Commissioner of Patents and Trademarks